United States Patent [19] [11] 3,974,380

Rettinghaus et al. [45] Aug. 10, 1976

[54] MASS SPECTROMETER

[75] Inventors: Gerhard Rettinghaus; Rudolf Flückiger, both of Balzers, Liechtenstein

[73] Assignee: Balzers Patent-und Beteiligungs AG, Liechtenstein

[22] Filed: Jan. 17, 1975

[21] Appl. No.: 541,955

[52] U.S. Cl. .............................. 250/288; 250/423 R
[51] Int. Cl.$^2$ .............................. H01J 37/08
[58] Field of Search ........... 250/288, 281, 282, 283, 250/284, 423, 424, 425, 426, 427

[56] References Cited

UNITED STATES PATENTS

| | | | |
|---|---|---|---|
| 2,836,750 | 5/1958 | Weimer | 250/288 |
| 3,553,451 | 1/1971 | Uthe | 250/292 |

*Primary Examiner*—Craig E. Church
*Attorney, Agent, or Firm*—McGlew and Tuttle

[57] ABSTRACT

The mass spectrometer is of the type having a mass-spectrometric separation system located in an evacuable chamber, an inlet to the chamber for the gases to be examined, and an ion source and a detector for the gas mixture constituting auxiliary devices in the chamber and having walls. The gas inlet and the auxiliary devices are arranged in series, with the gas inlet being formed as an inlet nozzle operable to form a jet of the gas to be examined and so designed, relative to the auxiliary devices, as to direct the jet, as a molecular beam, through one auxiliary device without contacting a wall thereof so that the jet enters directly into the other auxiliary device. The ion source is arranged between the detector and the nozzle, and may be designed as a hot-cathode ion source. The detector may be designed as a hot-cathode ionization detector or as an ion source of a second mass-spectroscopic separation arrangement. The detector may also be designed as an oscillator-crystal measuring device for measuring constituents of the gas deposited by condensation on one surface of the oscillator crystal. The mass-spectroscopic separation device may be designed as a quadrupole mass spectrometer.

6 Claims, 1 Drawing Figure

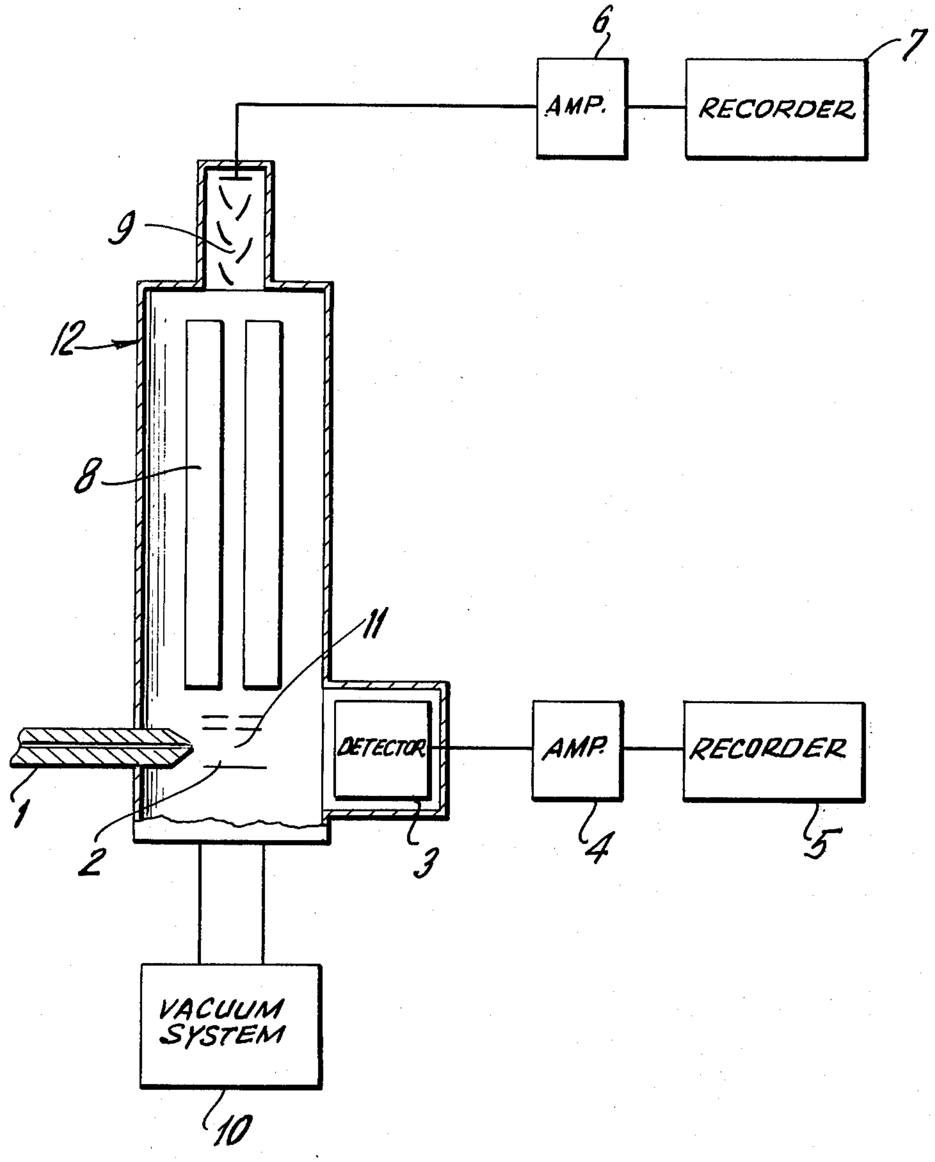
6
7
AMP.
RECORDER
9
12
8
11
DETECTOR
AMP.
RECORDER
1
2
3
4
5
VACUUM SYSTEM
10

MASS SPECTROMETER

FIELD AND BACKGROUND OF THE INVENTION

This invention relates to a mass spectrometer and, more particularly, to a mass spectrometer capable of lowering the detection limit for those components, of the gas mixture to be examined, which are present in an only very small concentration.

From German Pat. No. 1,798,377, there is known a device comprising a cold-cathode ionization gauge, a mass spectrometer with a hot-cathode ion source, an analyzer and collector, and a vacuum vessel provided with a gas inlet. In this device, in order to purify the gas prior to entering the ion source, the ionization gauge is disposed in the gas stream before the ion source. The purpose of this known arrangement is to prevent impurities, such as grease and oil vapors or other hydrocarbons, which are frequently contained in a gas stream to be analyzed, from passing into the ion source of the mass spectrometer. Such impurities may be decomposed on the hot-cathode of the ion source and lead to carbon deposits causing disturbances in operation.

From German preliminary Pat. No. 1,698,533, there is further known a high-vacuum ion source comprising a gas inlet system, devices for producing locally concentrated ionization energy in separated ionization zones in the high-vacuum space of the arrangement, devices for producing electric field forces which are effective up to the ionization zones, and separate systems for intercepting ions which have been withdrawn from the ionization zones by the field forces. In this arrangement, the ionization devices are designed so that, in two ionization zones, the ionization energies are rated differently to an extent such that, for certain constituents of the gas mixture, in particular for the component helium and the other components of the mixture, they are associated with considerable different levels of ionization probability. This known arrangement is directed to a high-vacuum gas ion source permitting an ionization of the analysis gas by means of different ionization energies and a separate measurement of the different ion streams resulting therefrom.

In connection with a mass spectrometer, this known arrangement may be used for the analysis of a gas mixture leaving a gas-chromatographic separation column. In such a case, the stream of analysis gas is split into two partial streams by means of a branching inlet conduit whose two branches must be symmetrically arranged and formed as similarly as possible from their junction, in order to assure that the two halves of each mixture component (peaks) pass the two ionization zones approximately simultaneously. The known arrangement has the drawback, however, that it is hardly possible to make the two branches exactly equal in form to an extent such that they would influence the different components of the examined gas mixture in exactly the same manner. Already a very small difference, for example, in length and width of the two branches, or a slightly different condition of the inner wall surfaces, which may easily happen during operation, causes a stronger adsorption of one or another component in one of the conduits relative to the other one, which results in measuring errors. This is particularly troublesome if there are to be detected components which are present in the gas mixture in only a very small concentration, so that the possibility of their detection, or detection limit, is substantially reduced.

SUMMARY OF THE INVENTION

The present invention is directed to an arrangement which does not require a splitting of the gas mixture, to be examined, into two partial streams, and which nevertheless makes it possible to ionize the gas in an ion source and, simultaneously, to detect it by means of a detector without being subjected to the mentioned drawbacks. The primary purpose of the present invention is to lower the detection limit, for those components, of the gas mixture to be examined, which are present in an only very small concentration and, therefore, approach the limit of the detection possibility.

In accordance with the invention, there is provided a mass spectrometer comprising a mass-spectrometric separation system located in an evacuable chamber, an inlet for the gas mixture to be examined, as well as an ion source and a detector responsive to the gas mixture, serving as auxiliary devices, the gas inlet and the auxiliary devices being arranged in series. The invention is characterized in that the gas inlet is designed as an inlet nozzle for forming a jet of the gas mixture and is so disposed, relative to the auxiliary devices, that the jet can pass through one of the auxiliary devices without contacting a wall thereof, and enter directly the other auxiliary device.

Due to the fact that the jet of analysis gas can pass through the first auxiliary device as a molecular beam without contacting a wall of the first auxiliary device, the known disadvantageous effects of such a wall contact are completely eliminated. At the same time, the high velocity of the gas molecules in the beam, amounting to several hundred meters per second, assures that the influencing of the second auxiliary device by a component to be detected is obtained pratically without any time delay. In contrast thereto, in a series arrangement of a cold-cathode ionization gauge and a hot-cathode ion source, the substantially lower velocity of the stream of analysis gas, only a few meters per second at the most, causes a hardly avoidable time delay disadvantageously manifesting itself in particular in the gas-chromatographic analysis using a rapid stream of carrier gas.

An object of the invention is to provide an improved mass spectrometer which does not require a splitting of the gas mixture, to be examined, into two partial streams.

Another object of the invention is to provide an improved mass spectrometer in which it is possible to ionize the gas in an ion source and simultaneously to detect it by means of a detector without the disadvantages of prior art mass spectrometers.

A further object of the invention is to provide a mass spectrometer in which the detection limit, for those components of the gas mixture which are present in only very small concentrations, and therefore approach the limit of the detection possibility, is lowered.

For an understanding of the principles of the invention, reference is made to the following description of a typical embodiment thereof as illustrated in the accompanying drawing.

BRIEF DESCRIPTION OF THE DRAWING

In the drawing, the single FIGURE is a simplified diagrammatical representation of a mass spectrometer embodying the invention.

DESCRIPTION OF THE PREFERRED EMBODIMENT

Referring to the drawing, an evacuable chamber 12 is supplied with the gas to be analyzed through an inlet 1. Chamber 12 contains an ion source 2, of a mass spectrograph, as a first auxiliary device, and contains a detector 3, for the analysis gas, as the second auxiliary device. For example, detector 3 may be a total-pressure gauge for registering the total variation of the stream of ions, or may be another ion source comprising a mass filter for registering the variation of the total pressure or the partial pressure. An amplifier 4 is connected to detector 3, and a recorder 5, for the detector signal, is connected to the output of amplifier 4. It will be noted that inlet 1, ion source 2 and detector 3 are arranged in series with each other.

Evacuable chamber 12 also has located therein a mass-spectrometric separation system 8, such as a quadrupole analyzer, in association with a secondary electron multiplier 9 connected to an amplifier 6 having a recorder, for the mass spectrum, connected to its output. The hot-cathode of the mass spectrometer is indicated at 11, and extends perpendicularly to the plane of the drawing. A vacuum pumping system 10 is connected to evacuable chamber 12 to maintain the vacuum therein.

As previously mentioned, gas inlet 1 is designed as an inlet nozzle through which the analysis gas passes into the space of the ion source 2, which space is evacuated during operation, and forms a directed gas jet or molecular beam. Relative to ion source 2, inlet nozzle 1 is so disposed that the beam can pass through ion source 2 without substantial hindrance and above all, if possible, without contacting a wall of ion source 2. Consequently, an appropriately designed, so-called "open", ion source must be used. Furthermore, care must be taken that a perhaps provided hot-cathode of the ion source, the intersection of which with the drawing plane is indicated by the point 11, is located outside the beam.

For the objective of the invention, there is usable any known ion source permitting a molecular beam to pass therethrough. If, in accordance with the invention, detector 3 is used as the first auxiliary device, the same considerations apply to detector 3. While such an arrangement, in which ion source 2 and detector 3 are interchanged, is possible, however in most cases, it is less advantageous since, in general, the sensitive volume of the ion source is small and therefore it should be disposed at a location where the cross-sectional area of the beam is small, thus near the gas inlet nozzle 1.

Usually, the ion source is designed as a hot-cathode ionization device and supplies the ions for the mass-spectrometric examination in a well known manner. The ions pass through the apertures of the ion source 2 directly into the quadrupole-bar system 8, but only a single sort of ions having a definite charge/mass ratio, hereinafter referred to as the e/m ratio, can pass through the mass filter in each case, while the ions having different e/m ratios are eliminated by neutralization. The ions having passed through the mass filter 8 are then detected by means of the secondary electron multiplier 9 whose respective signal current, after amplification in amplifier 6, is registered by a recorder 7.

If the adjustment of the mass filter is varied through a certain e/m range, so that the corresponding portion of ions having this e/m ratio, is registered as a function of time, a mass spectrum is obtained. As to details concerning the function and operation of a quadrupole mass filter, reference is made to the pertinent literature. Other kinds of mass spectrometers may, of course, also be used in the arrangement of the invention. However, due to its reliability, the quadrupole mass filter 8 has proved particularly useful.

Detector 3, responsive to the analysis gas, may also be of various designs. An ionization gauge, for measuring the total ion stream, or a device for measuring a certain portion of the ions, may be used. For example, if the device is used in connection with a gas-chromatographic separation column, it is advantageous to provide a detector responsive only to the ions formed by the components of the substance to be analyzed, and not to the carrier gas. This can be obtained, for example, by a hot-cathode ionization detector in which the operating voltage is chosen so low that the helium, because of its relatively high ionization potential of 24.5 V, is not subject to ionization while the substances to be detected which, in most cases, have a substantially lower ionization potential, are ionized.

Detector 3 could also be designed as a surface ionization detector, or as a second mass-spectrometric separation arrangement permitting the detection of the total of ions of an interesting e/m range. In the last-mentioned case, the part 3 of the drawing could represent the ion source of the second mass-spectrometric separation arrangement.

Other suitable detectors are the oscillator-crystal measuring devices frequently used in vacuum evaporation technology for measuring the layer thickness. In order to detect condensable constituents of the analysis gas, such constituents may be deposited on a surface of the oscillator crystal, whose frequency thereby is changed, and continuously measured. In principle, any detector is usable which is capable of operating under the given vacuum conditions.

During operation, the chamber 12 containing the ionization space of ion source 2, must be evacuated and, consequently, also the measuring space of detector 3. Advantageously, there is used a detector which permits a low pressure such that the particles of the gas jet, leaving nozzle 1, no longer collide with particles of the residual gas, or collide only relatively rarely, in the case of molecular beams. On the other hand, however, the gas density in the beam must be sufficiently high for a sufficient number of ions to be formed for the operation of the mass spectrometer.

As indicated in the drawing, the signal, of any kind, formed by detector 3 is supplied to the processing device 4, usually an amplifier, to the output of which a recorder 5, for recording the signal variations, may be connected.

Simultaneous examination of the analysis gas by means of a mass spectrometer and a further detector is known per se. By combining the two results of measurement, further conclusions can be made as to the analyzed gas. As already mentioned, for gas-chromatographic purposes, a gas-chromatographic detector is used and furnishes the gas-chromatogram of the sample in a well-known manner. At the same time, each of the chromatographically separated components may be subjected to a mass-spectrometric examination. In such cases, it is very important, for a certain association of the respective mass-spectrogram to the corresponding gas-chromatographic component or "peak", to avoid, if possible, any indefinite time delay between the two measurements. As compared to such an indefinite time delay which, when detected, can be taken into account during evaluation, still worse is a varying retardation of the individual components, which can easily occur in the known branched conduits because of the differential surface adsorption.

In the arrangement of the invention, this danger is eliminated. In addition, the invention has another advantage in that the velocity at which the sample of analysis gas can be measured is determined only by the electronic processing of the signals, and no longer by the flow velocity of the gas in the branched conduits. Thus, in connection with suitable electronic measuring devices, the invention provides an acceleration of the analysis.

While a specific embodiment of the invention has been shown and described in detail to illustrate the application of the principles of the invention, it will be understood that the invention may be embodied otherwise without departing from such principles.

What is claimed is:

1. In a gas-chromatographic detector comprising a mass-spectrometric ion separation system located in an evacuable chamber, a sample gas inlet to the chamber including nozzle means for forming a gas jet, from the sample gas delivered from a gas-chromatographic column into the chamber, an ionization device for the sample gas, and in which the gas jet formed by the nozzle passes through the ionization device without contacting the walls thereof while being ionized, means for passing ions formed by said ionization device into said separation system and a first ion responsive detector placed to receive ions from said separation system, the improvement comprising a second detector which is responsive to the ions formed of the components of the sample gas but not to the gas-chromatographic carrier gas, the arrangement being such that the sample-gas jet leaving said nozzle passes in a substantially straight line through said ionization device directly into said second detector

2. In a chromatographic detector, the improvement claimed in claim 1, in which said second detector is designed as a surface ionization detector.

3. In a chromatographic detector, the improvement claimed in claim 1, in which said ionization device is designed as a hot-cathode ion source.

4. In a chromatographic detector the improvement claimed in claim 1, in which said second detector is designed as a hot-cathode ionization detector.

5. In a chromatographic detector, the improvement claimed in claim 1, in which said second detector is designed as an ion source of a second mass-spectroscopic separation arrangement.

6. In a chromatographic detector, the improvement claimed in claim 1, in which said second detector is designed as an oscillator-crystal measuring device for measuring constituents of the gas mixture, to be examined, deposited by condensation on one of the surfaces of the oscillator-crystal.

* * * * *